United States Patent [19]
Yano et al.

[11] Patent Number: 5,194,764
[45] Date of Patent: Mar. 16, 1993

[54] DATA OUTPUT BUFFER CIRCUIT FOR SEMICONDUCTOR INTEGRATED CIRCUIT HAVING OUTPUT BUFFERS WITH DIFFERENT DELAYS

[75] Inventors: Junji Yano, Yokohama; Tsukasa Miyawaki, Fujisawa; Masami Atoh, Yokohama; Masakazu Gotou, Kawasaki; Masakazu Iwashita, Tokyo; Michio Kaji, Machida, all of Japan

[73] Assignee: Kabushiki Kaisha Toshiba, Kawasaki, Japan

[21] Appl. No.: 627,058

[22] Filed: Dec. 13, 1990

[30] Foreign Application Priority Data

Dec. 14, 1989 [JP] Japan ................................ 1-324754

[51] Int. Cl.$^5$ .......................................... H03K 19/094
[52] U.S. Cl. .................................. 307/443; 307/448; 307/475; 307/481
[58] Field of Search ............... 307/443, 448, 450, 451, 307/452, 453, 475, 542, 552, 263, 246, 268, 262, 601, 602, 603, 605, 606, 279, 290, 291, 481; 365/189.06, 189.08, 206, 226, 230.01

[56] References Cited

U.S. PATENT DOCUMENTS

| | | | |
|---|---|---|---|
| 3,737,673 | 6/1973 | Suzuki | 307/452 |
| 4,417,158 | 11/1983 | Ito et al. | 307/262 X |
| 4,518,873 | 5/1985 | Suzuki et al. | 307/451 |
| 4,786,824 | 11/1988 | Masuda | 307/601 X |
| 4,857,765 | 8/1989 | Cahill et al. | 307/443 |
| 4,882,507 | 11/1989 | Tatsumi et al. | 307/443 |
| 4,883,986 | 11/1989 | Egawa et al. | 307/298 |
| 4,924,120 | 5/1990 | Schenck | 307/443 X |
| 4,959,563 | 9/1990 | Schenck | 307/451 X |
| 4,972,100 | 11/1990 | Lim et al. | 307/451 X |
| 4,975,599 | 12/1990 | Petrovick, Jr. et al. | 307/443 |
| 4,983,861 | 1/1991 | Kikuchi et al. | 307/443 |
| 4,992,677 | 2/1991 | Ishibashi et al. | 307/443 |

FOREIGN PATENT DOCUMENTS

| | | | |
|---|---|---|---|
| 0148426 | 8/1984 | Japan | 307/443 |
| 0130920 | 7/1985 | Japan | 307/443 |

Primary Examiner—David Hudspeth
Attorney, Agent, or Firm—Foley & Lardner

[57] ABSTRACT

A data output buffer circuit for a semiconductor integrated circuit has a plurality of output buffer circuits. Each output buffer circuit has an input terminal for receiving input data and an output buffer having first and second switching circuits serially connected between two high and low power source terminals. Each of the first and second switching circuits has a control terminal for turning on and off each of the first and second switching circuits upon receipt of a control signal at the control terminals. A timing signal input terminal receives a timing signal with which the output buffer circuit operates in synchronism. A timing switch connects the next stage of the input terminal and is turned on by the timing signal. A delay signal is connected between the timing switch means and the control terminals of the first and second switching circuits and delays the input data from the input terminal and transmits the delayed input data to the control terminals of the first and second switching circuits. The delay time of the delay circuit of one of the output buffer circuits is different from the delay time of another of the output buffer circuits. An output terminal connects to the interconnection between the first and second switching circuits.

8 Claims, 16 Drawing Sheets

PEAK CURRENT

PEAK CURRENT

PEAK CURRENT

DATA OUTPUT BUFFER CIRCUIT FOR SEMICONDUCTOR INTEGRATED CIRCUIT HAVING OUTPUT BUFFERS WITH DIFFERENT DELAYS

FIELD OF THE INVENTION

The present invention relates to a data output buffer circuit for a semiconductor integrated circuit.

BACKGROUND OF THE INVENTION

As shown in FIG. 25, a microprocessor, its peripheral LSI, and the like have a number of output buffers OB for outputting an address signal and a data signal. A 16 bit microprocessor has, for example, 20 output buffers for outputting an address/data signal. Examples of the internal circuit of each output buffer OB are shown in FIGS. 26 and 27. Each output buffer OB is controlled by a timing signal T to output an address/data signal supplied from a bus BUS such as an address bus and data bus. When an address/data signal is outputted, one of two transistors (P-MOS transistor Tr1 and N-MOS transistor Tr2 in FIG. 26, or N-MOS transistors Tr3 and Tr4 in FIG. 27) connected in series between high and low power sources turns on and the other turns off. When an inverted signal is outputted from the output buffer OB, the on/off state of the two transistors is reversed. If both two transistors turn on momentarily at the same time during the transient state while the state of the two transistors is reversed, a through current will flow via the two transistors between the high and low power source terminals. FIG. 28 shows a through current flowing in the output buffer OB shown in FIG. 26 when an output signal is inverted. As seen from FIG. 26, a through current will flow at time t1 and time t2 when an output of the output buffer is inverted from "1" to "0" and from "0" to "1", respectively. The output buffers OB are all controlled by the same timing signal T, so that a through current may flow through a plurality of output buffers OB at the same time. The total through current may take a value in the order of ampere. Thus, the potential of the internal power source line changes greatly resulting in a possible malfunction.

Furthermore, a number of output buffers OB shown in FIG. 25 operate in response to the same timing signal as described above. Therefore, for example, if many of output buffers change its output level from "H" level to "L" level, a rush current flowing through the ground pin (GND) of the semiconductor integrated circuit takes a value in the order of ampere. Thus, the potential (internal power source potential) at the ground pin rises, resulting in a malfunction. FIG. 29 illustrates a rise of the ground (GND) potential when all output buffers OB change its output level from "1" level to "0" level.

According to the background art, the timing signal is supplied via delay means DL to each output buffer OB in order to prevent the ground potential from rising, as seen from FIG. 30. Therefore, as shown in FIG. 31, the operation timings of the output buffers OB are shifted sequentially so that the total current flowing at any timing can be suppressed to a small value.

The above method using the delay means is however associated with the following disadvantage. Specifically, the pulse width of the timing signal T is generally the same as that of the main clock used within the LSI, so that sometimes an output pulse may not be obtained from the timing signal after it has passed through the delay means. This case will be described with reference to FIGS. 32 to 34. FIG. 32 shows an example of a delay means, FIG. 33 illustrate a normal state where a pulse is outputted, and FIG. 34 illustrates an abnormal state where a pulse is not outputted. If a pulse indicated at "A" in FIG. 33 is applied to the input IN of the delay means shown in FIG. 32, there are obtained pulses indicated at "B" and "C" in FIG. 33 at the circuit portions shown in FIG. 32, and finally a pulse indicated at "D" in FIG. 33. In FIG. 33 a delay time is represented by DT. If the input pulse width is narrowed so as to speed up the operation time as seen from FIG. 34, there is obtained no pulse as indicated at "D" in FIG. 34. In other words, if delay means are used, it is not possible to make high the operation frequency (speed) of a semiconductor integrated circuit.

As described above, according to the background art, there is a possibility of a malfunction because of a through current flowing into an output buffer when an output level is inverted. There is also a possibility of a malfunction if many output buffers operate at the same time in response to the same timing signal. In order to eliminate the effect of such simultaneous operations, the operation timings for output buffers may be shifted. However, in this case, it is not possible to make high the operation speed. Namely, the influence of power source noises has not been effectively suppressed heretofore.

SUMMARY OF THE INVENTION

The present invention has been made in consideration of the above circumstances, and aims at providing a semiconductor integrated circuit capable of effectively suppressing power source noises.

According to the present invention, it is possible to eliminate a rush current to be caused at the time of changing an output level of an output buffer, and to prevent all output buffers from operating at the same time, thereby allowing reduction of power source noises. Furthermore, a noise eliminator circuit or a delay circuit for delaying either a leading edge or a trailing edge can be realized with a smaller number of transistors than conventionally.

According to an aspect of this invention, there is provided a data output buffer circuit for a semiconductor integrated circuit, including an input terminal for receiving an input data; an output buffer having first and second switching circuits serially connected between two high and low power source terminals, each of the first and second switching circuits having a control terminal for turning on and off each of the first and second switching circuits upon reception of a control signal to the control terminal; an output terminal connected to an interconnection between the first and second switching circuits; and a through current blocking circuit for applying a first control signal to the control terminal of each of the first and second switching circuits when the level of the input data is changed, so as to turn off both the first and second switching circuits, and thereafter applying a second control signal to the control terminal of each of the first and second switching circuits, so as to obtain an output signal corresponding to the input data.

According to another aspect of this invention, there is provided a data output buffer circuit for a semiconductor integrated circuit having a plurality of output buffer circuits, each output buffer circuit including an input terminal for receiving an input data; an output buffer having first and second switching circuits serially connected between two high and low power source terminals, each of the first and second switching circuits having a control terminal for turning on and off each of the first and second switching circuits upon reception of a control signal to the control terminal; a through current blocking circuit for applying a first control signal to the control terminal of each of the first and second switching circuits when the level of the input data is changed, so as to turn off both the first and second switching circuits, and thereafter applying a second control signal to the control terminal of each of the first and second switching circuits, so as to obtain an output signal corresponding to the input data; and an output terminal connected to an interconnection between the first and second switching circuits; wherein each output buffer circuit operates to output an output data for each of a plurality of input data to the external at the same time.

According to a further aspect of the invention, there is provided a semiconductor integrated circuit wherein a first transistor of a first channel type and second and third transistor of a second channel type are connected in series between a pair of power source terminals, the gate of the first transistor and the gate of one of the second and third transistors are connected to an input terminal, the input terminal is connected via a delay circuit to the gate of the other of the second and third transistors, and an interconnection between the first and second transistors is connected to an output terminal.

DESCRIPTION OF THE PREFERRED EMBODIMENTS

FIGS. 1 to 8 are circuit diagrams and operation timing charts of the first to fourth embodiments wherein a through current is prevented from flowing into an output buffer OB at the time of changing an output level thereof.

In all of the first to fourth embodiments, two output transistors Tr1 and Tr2 (P- and N-type transistors) at the output terminal are turned off (with the output levels being high impedance Z) prior to the level change of an output signal, and in this state one of the transistors Tr1 and Tr2 is turned on and the other is turned off, to thereby establish the output level while blocking a through current.

Each embodiment will be described with reference to FIGS. 1 to 8.

Figure 1:
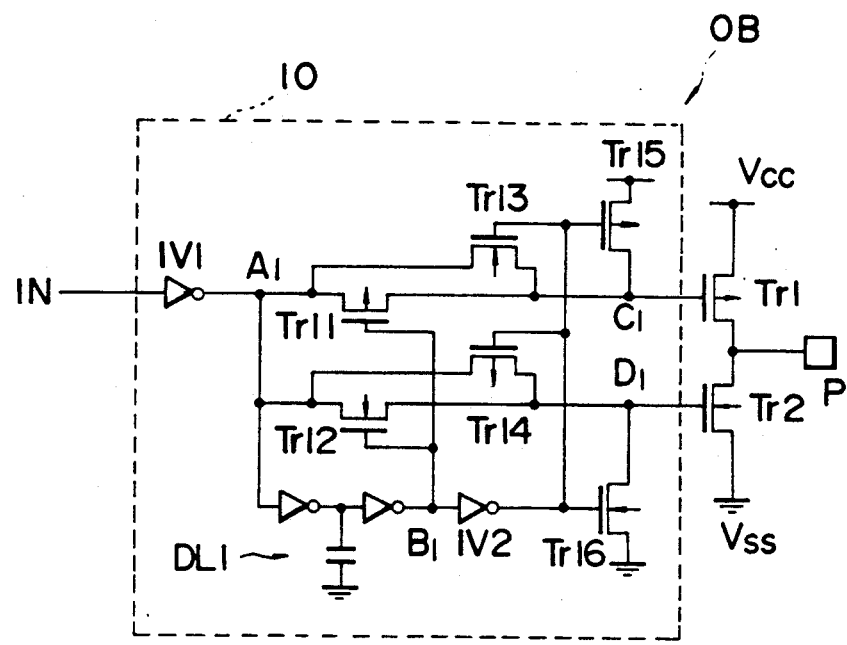
FIGS. 1 to 8 are timing charts and circuit diagrams of the first to fourth embodiments of a through current block circuit according to the present invention.

Referring first to FIG. 1, an input data such as an address signal and a data signal from a memory cell, a register and the like is applied to an input terminal IN connected to an inverter IV1. An output terminal of the inverter IV1 is connected to the gate of an output transistor Tr1 via a transistor Tr11, and to the gate of an output transistor Tr2 via a transistor Tr12. The transistors Tr11 and Tr12 are connected in parallel with transistors Tr13 and Tr14. The gates of the transistors Tr1 and Tr2 are pulled up and down by transistors Tr15 and Tr16, respectively. The output terminal of the inverter IV1 is also connected to a delay circuit DL1. The output terminal of the delay circuit DL1 is connected to the gates of the transistors Tr11 and Tr12, and to an inverter IV2 whose output terminal is connected to the gate of the transistors Tr13 to Tr16.

Figure 2:
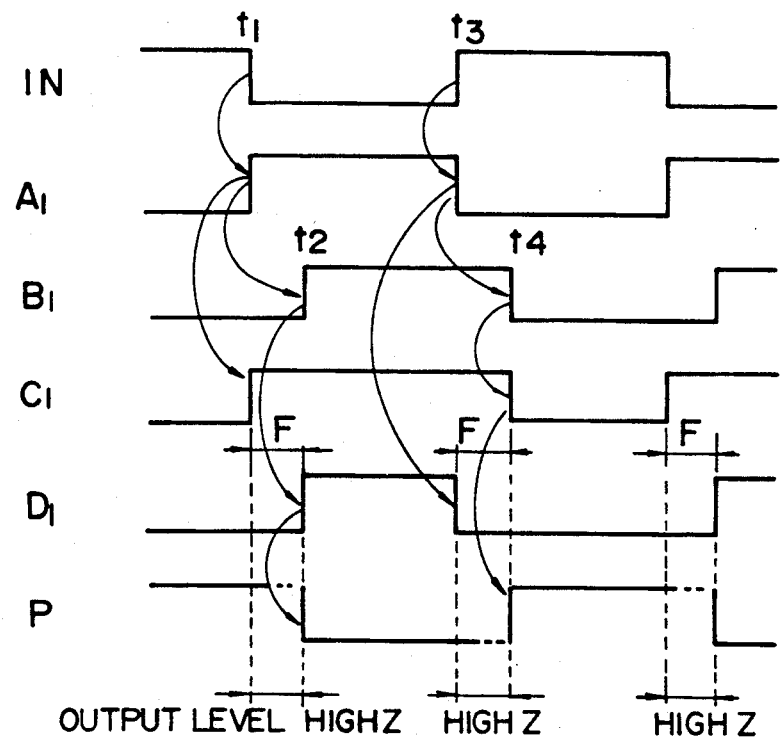

The circuit shown in FIG. 1 operates as follows. Referring to FIG. 2, when the signal at the input terminal IN falls at time t1, the level at point A1 rises because of the function of the inverter IV1. This level rise is transmitted via the transistor Tr11 to point C1 to raise the level at point C1. This level rise at point C1 causes the output transistor (P-type) Tr1 to turn off. At this time, the level at point D1 is "L" level so that the transistor Tr2 also is caused to turn off. As a result, the output level of the transistors Tr1 and Tr2 enters a high impedance state after time t1. The level rise at point A1 is transmitted to and reaches point B1 via the delay circuit DL1 at time t2. Therefore, the level at point D1 rises so that the transistor Tr2 turns on and the level at the output terminal P lowers to "L". The above operation can be understood from curved arrows indicated near at times t1 and t2 in FIG. 2. The transistor Tr2 is turned on during the delay time F of the delay circuit DL1, i.e., during the off-state or high impedance state of both the transistors Tr1 and Tr2. A through current will not flow accordingly through the transistors Tr1 and Tr2, thereby suppressing the potential change of the power source line.

Similar to the above case, the level rise at the output terminal P after the level rise of the signal applied to the input terminal IN is carried out during the off-state of both the transistors Tr1 and Tr2. Therefore, also in this case a through current will not be generated. Although the detailed description for this case is omitted, the operation can be understood from curved arrows near at time t3 and t4 in FIG. 2.

The circuit shown in FIG. 3 will be described next.

Transistors Tr21 to Tr23 as well as transistors Tr24 to Tr26 are serially connected between a pair of power sources $V_{CC}$ and $V_{SS}$. An input terminal IN is connected to the gates of the transistors Tr21 and Tr22, and to the gates of the transistors Tr25 and Tr26. The input terminal IN is also connected via a delay circuit DL2 to the gates of the transistors Tr23 and Tr24. The interconnection between the transistors Tr21 and Tr22 is connected to the gate of a transistor Tr1. The interconnection between the transistors Tr25 and Tr26 is connected to the gate of a transistor Tr2.

The circuit shown in FIG. 3 operates as follows. When the signal at the input terminal IN falls at time t1, the transistor Tr21 turns on and the level at point B2 rises. This level rise at point B2 causes the output transistor Tr1 to turn off. At this time, the level at point C2 is "L" level so that the output transistor Tr2 also is caused to turn off. As a result, both the output transistors Tr1 and Tr2 turn off and enter a high impedance state. The level fall at time t1 at the input terminal IN reaches point A2 via the delay circuit DL2 at time t2. Therefore, the level fall at point A2 causes the transistor Tr24 to turn on so that the level at point C2 rises and the transistor Tr2 turns on to lower the level at the output terminal P. As above, since the transistor Tr2 is turned on under the condition that both the transistors Tr1 and Tr2 are in an off-state, a through current will not flow.

Similar to the above case, the level rise at the output terminal P after the level rise of the signal applied to the input terminal IN is carried out during the off-state of both the transistors Tr1 and Tr2. Therefore, also in this case a through current will not be generated. Although the detailed description for this case is omitted, the operation can be understood from curved arrows near at time t3 and t4 in FIG. 4.

Figure 5:
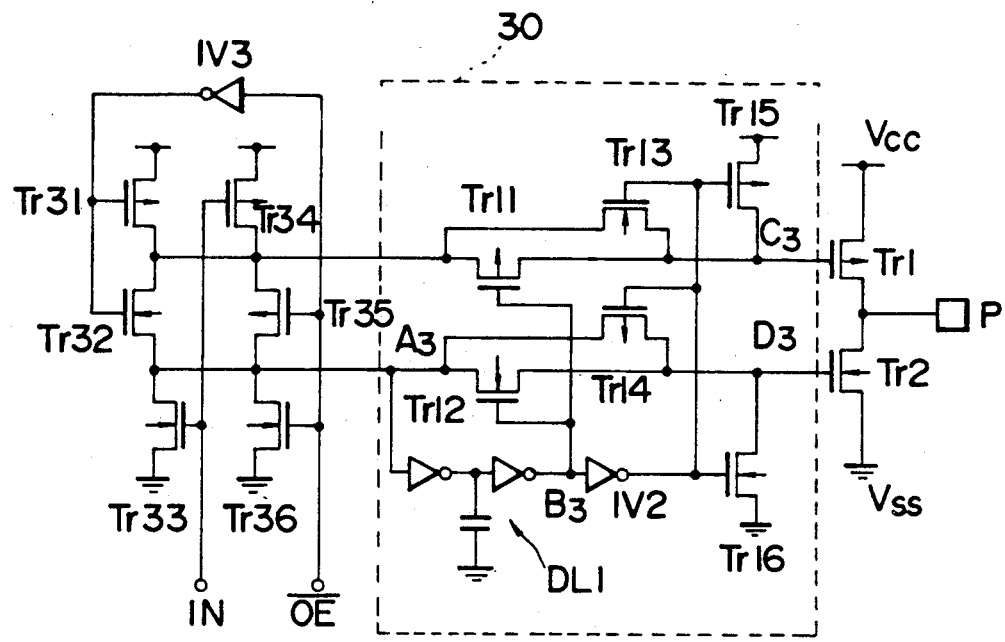
Figure 6:
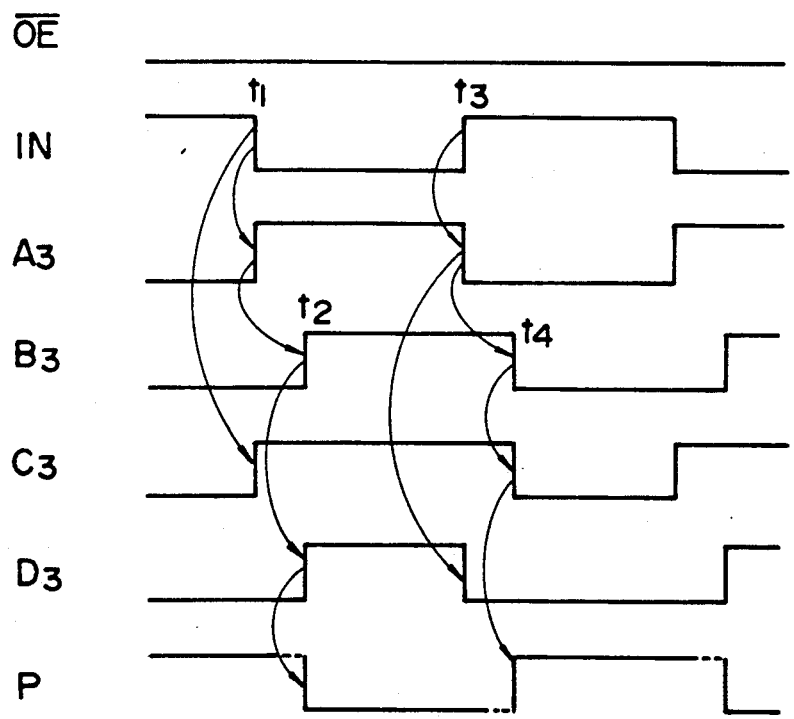

The circuit shown in FIG. 5 will be described next.

Transistors Tr31 to Tr33 as well as transistors Tr34 to Tr36 are serially connected between a pair of power sources $V_{CC}$ and $V_{SS}$. An output enable signal input terminal ($\overline{OE}$ input terminal) is connected to the gates of the transistors Tr36 and Tr35, and via an inverter IV3 to the gates of the transistors Tr33 and Tr34. The interconnection between the transistors Tr31 and Tr32 as well as the interconnection between the transistors Tr34 and Tr35 are connected to a transistor 11 of a through current block circuit 30. The interconnection between the transistors Tr32 and Tr33 as well as the interconnection between the transistors Tr35 and Tr36 is connected to point A3 of the block circuit 30. This block circuit 30 has the same structure as the block circuit 10 shown in FIG. 1, and like elements to those shown in FIG. 1 are represented by using identical reference symbols.

The circuit shown in FIG. 5 operates as follows. When the level at the input terminal IN falls at time t1, the transistor Tr33 turns off and the transistor Tr34 turns on. When the transistor Tr33 turns off, the level at point A3 rises. When the transistor Tr34 turns on, the level at point C3 rises. The following operation is similar to FIG. 1 as understood from curved arrows shown in FIG. 6. Namely, the output transistor Tr2 turns on under the condition that both the output transistors Tr1 and Tr2 are in an off-state.

A similar operation is carried out for the case where the level at the input terminal IN rises at time t3. This operation can be understood from curved arrows near at times t3 and t4 in FIG. 6.

Figure 7:
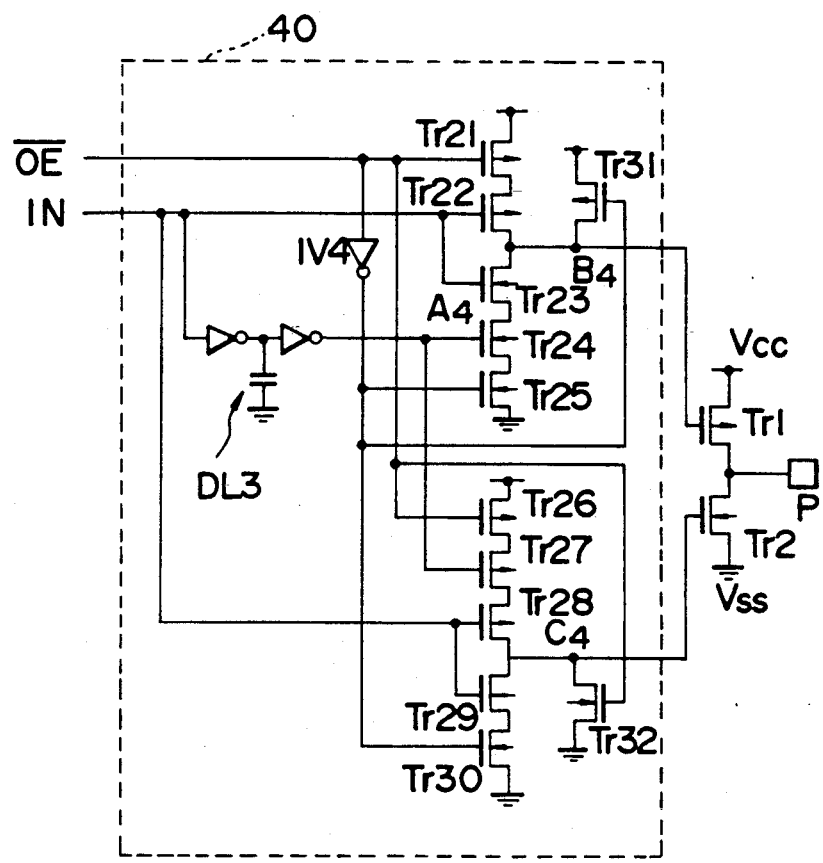

The circuit shown in FIG. 7 will be described next.

Within a through current block circuit 40, transistors Tr21 to Tr25 as well as transistors Tr26 to Tr30 are serially connected between a pair of power sources $V_{CC}$ and $V_{SS}$. An interconnection between the transistors Tr22 and Tr23 is connected to the gate of an output transistor Tr1. This gate is pulled up by a transistor Tr31. An interconnection between the transistors Tr28 and Tr29 is connected to the gate of an output transistor Tr2. This gate is pulled down by a transistor Tr32.

An output enable signal input terminal ($\overline{OE}$ input terminal) is connected to the gates of the transistors Tr21, Tr26 and Tr32, and via an inverter IV4 to the gates of the transistors Tr25, Tr31 and Tr30. An input terminal IN is connected to the gates of the transistors Tr22, Tr23, Tr28 and Tr29, and via a delay circuit DL3 to the transistors Tr24 and Tr27.

The circuit shown in FIG. 7 operates as follows. When the signal at the input terminal IN falls at time t1, the transistor Tr22 turns on and the level at point B4 rises. This level rise at point B4 causes the transistor Tr1 to turn off. At this time, the level at point C4 is "L" level so that the transistor Tr2 also is caused to turn off. As a result, both the output transistors Tr1 and Tr2 turn off and enter a high impedance state. Thereafter, the level fall at time t1 reaches point A4 via the delay circuit DL3 at time t2 to lower the level at point A4. Therefore, the level fall at point A4 causes the transistor Tr27 to turn on so that the level at point C4 rises. With the level rise at point C4, the transistor Tr2 turns on to lower the level at the output terminal P. As above, since the transistor Tr2 is turned on under the condition that both the transistors Tr1 and Tr2 are in an off-state and in a high impedance state, a through current will now flow.

Similar to the above case, the level rise at the output terminal P after the level rise of the signal applied to the input terminal IN is carried out during the off-state of both the transistors Tr1 and Tr2. Therefore, also in this case a through current will not be generated. Although the detailed description for this case is omitted, the operation can be understood from curved arrows near at time t3 and t4 in FIG. 8.

Figure 8:
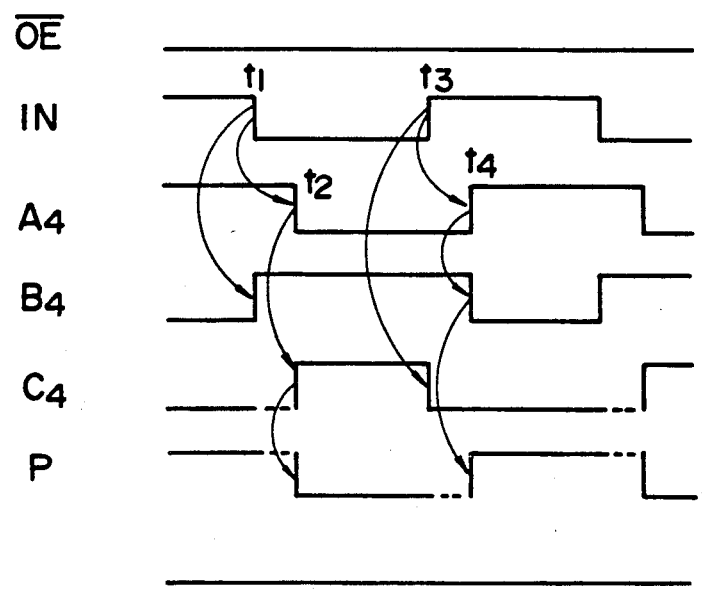
Figure 8A:
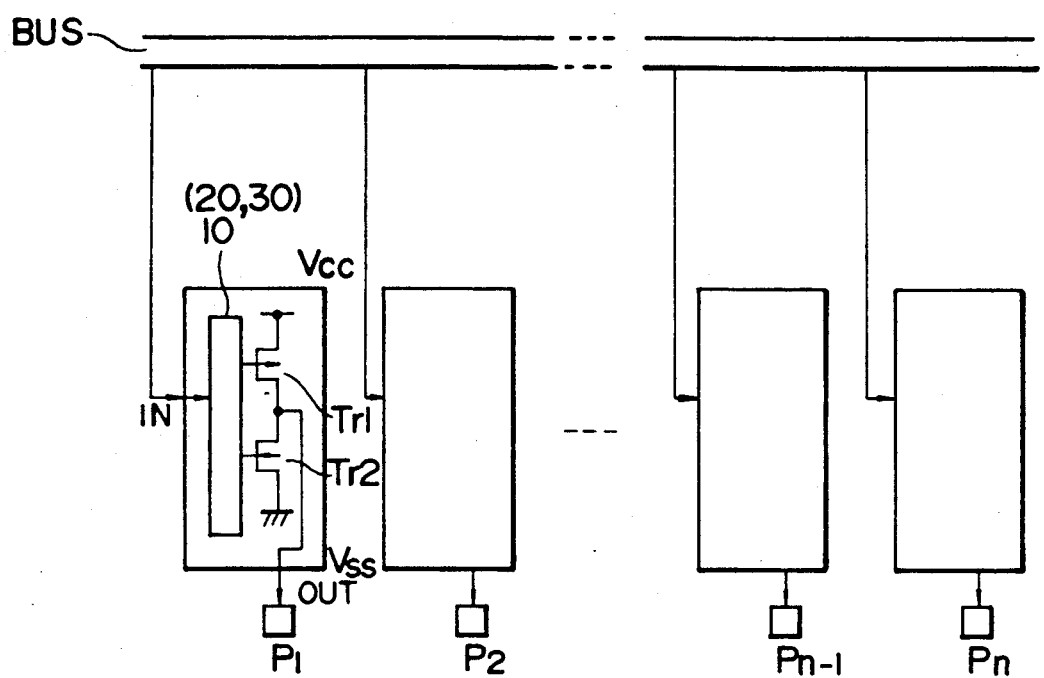
FIG. 8A is a circuit diagram showing a device having a plurality of output buffers each having the through current block circuit.

FIG. 8A shows a device having a plurality of pairs of the through current block circuit 10 (20, 30) and the output buffer (Tr1, Tr2). A plurality of data are outputted from terminals P1 to Pn at the same time.

Figure 9:
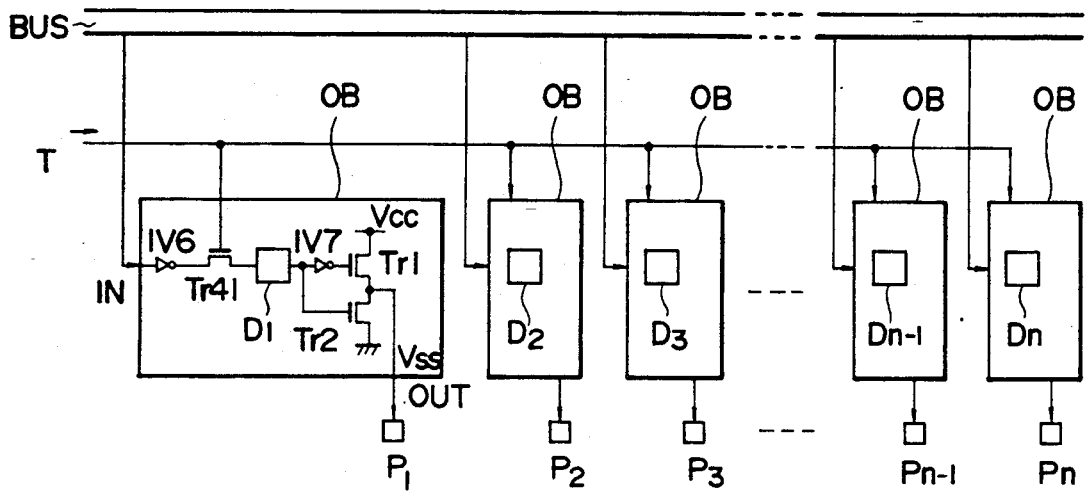
FIG. 9 is a circuit diagram of the circuit wherein the operations of output buffers are shifted, according to an embodiment of this invention.

FIG. 9 is a circuit diagram showing the main part of an embodiment wherein the operation timings of output buffers OB are shifted. In particular, an input terminal IN of an output buffer OB to be inputted with a signal (address/data signal) from a bus BUS, is connected to a delay circuit D1 (D2 to Dn) via an inverter IV6 and transistor Tr41. The output terminal of the delay circuit D1 is connected to the gate of a transistor Tr2, and via an inverter IV7 to the gate of a transistor Tr1. In FIG. 9, although the internal circuit of one output buffer OB is shown, the internal circuit of each of the other output buffers OB is substantially the same. However, the delay time of the delay circuit D1 to Dn in each output buffer OB is arranged to become slightly larger in the order recited. When the timing signal T is outputted, it is applied to transistors 41 of the output buffers OB at the same time. Since the delay time of each delay circuit D1 to Dn is slightly different from each other, the output buffers OB sequentially start operating with a time difference, starting from the left side to the right side shown in FIG. 9. Accordingly, an output is delivered first at an output terminal P1, then at an output terminal P2, and so on. Such a circuit arrangement allows to deal with a high operation frequency and make small a peak current flowing through the ground pin, thereby preventing a malfunction.

The delay time of the delay circuit is changed for each output buffer as described above. The same delay time for a plurality of output buffers may also be used. For example, the output terminals are divided into groups P1 to P4, P5 to P8, and so on each group containing four output terminals and having the same delay time.

Figure 10:
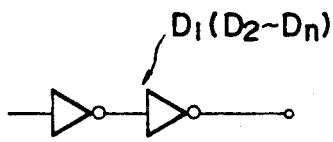
FIGS. 10 to 12 are examples of a delay circuit used with the circuit shown in FIG. 9.
Figure 11:
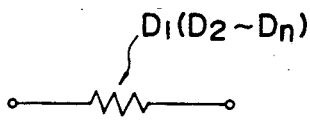
Figure 12:
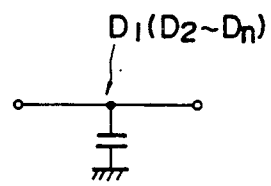

Various circuit arrangements are possible for the delay circuit. For example, as shown in FIGS. 10 to 12, the delay circuit may be constructed of a plurality of serially connected inverters, a plurality of resistors, a plurality of capacitors, or a combination thereof. In order to change the delay time, the size of a transistor constituting an inverter, the number of inverters to be connected, the value of a resistor, or the value of a capacitor, is changed.

Figure 3:
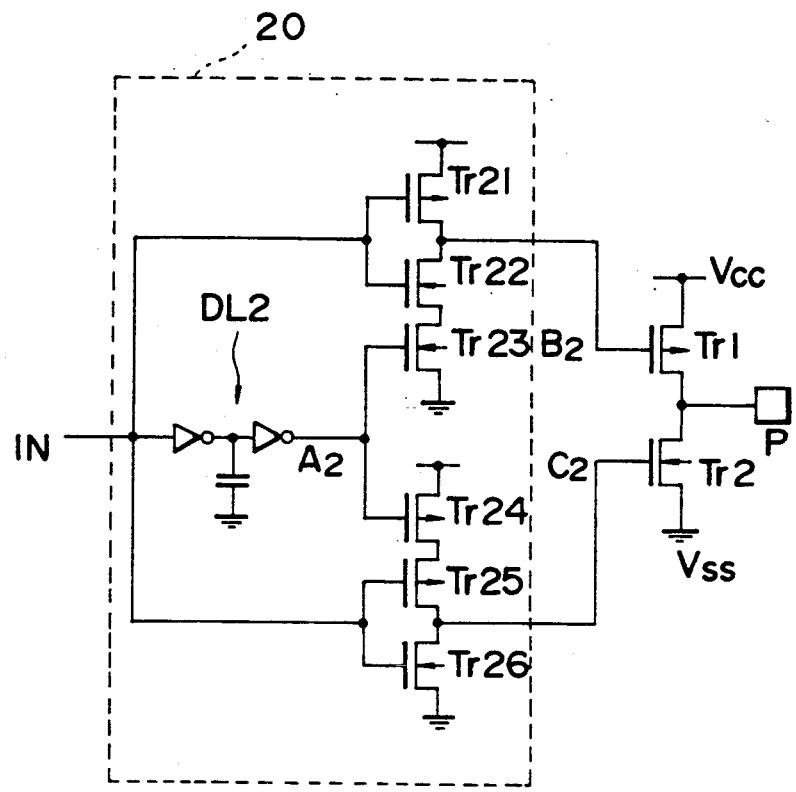
Figure 4:
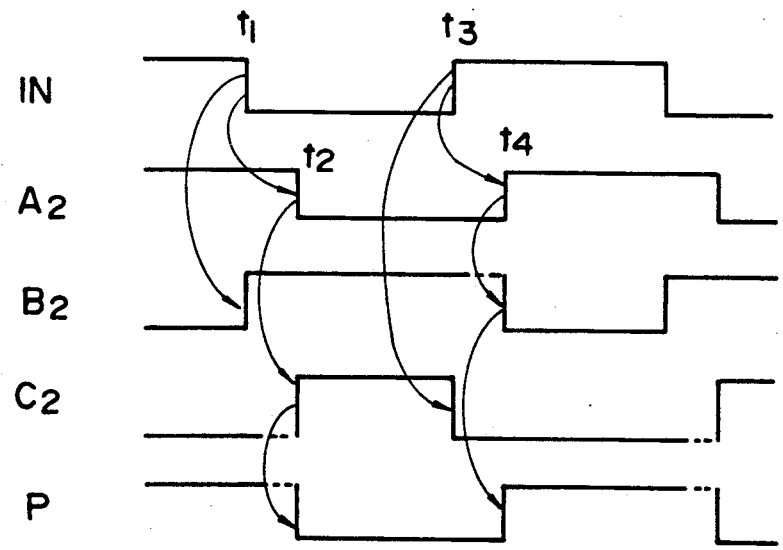

In the through current block circuit 20 shown in FIG. 3, the first circuit constructed of a combination of the delay circuit DL2 and three transistors Tr21 to Tr23 or the second circuit constructed of a combination of the delay circuit DL2 and three transistors Tr24 to Tr26 may be used as a circuit for delaying the leading edge or trailing edge of an input signal or as a noise eliminator circuit for eliminating noises superposed upon an input signal.

Figure 13:
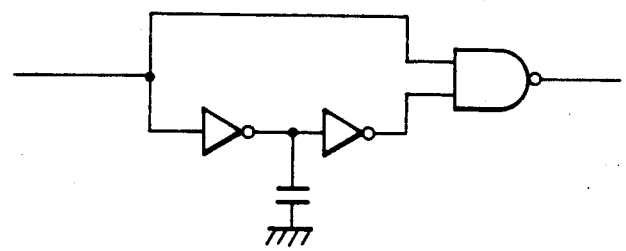
FIG. 13 is a basic circuit diagram of a noise suppressor/trailing edge delay circuit.
Figure 15:
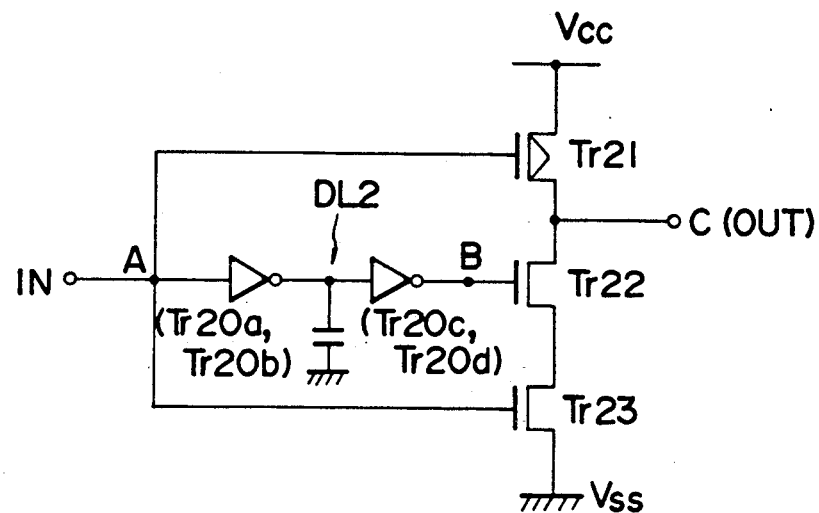
FIG. 15 is a circuit diagram showing an embodiment of the circuit shown in FIG. 13.

The first circuit is shown in FIG. 15, and its equivalent circuit is shown in FIG. 13. The operation of this circuit is illustrated in FIGS. 16 to 18.

Figure 16:
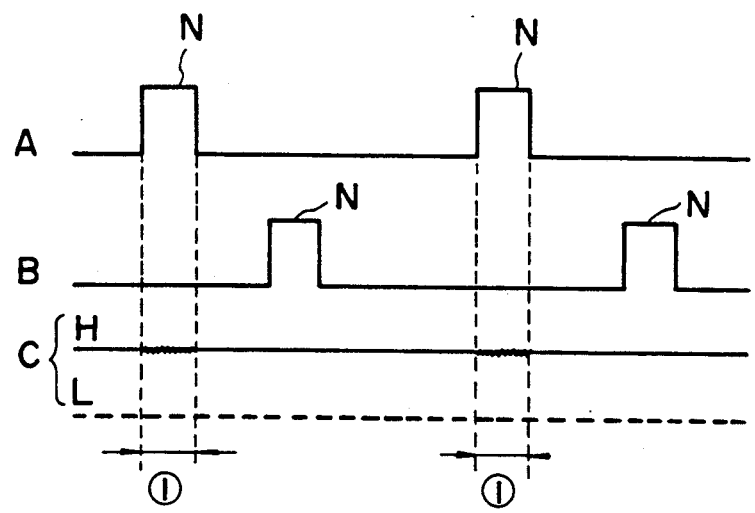
FIGS. 16 to 18 are timing charts illustrating examples of the operation of the circuit shown in FIG. 15.

FIG 16 illustrates a noise eliminating operation. Referring to FIG. 16, it is assumed that a noise N is superposed on a signal at the input terminal IN. This noise N is transmitted to the transistor Tr21 so that its output becomes a high impedance state (tri-state). This first circuit processes an internal signal so that its load is negligibly small, and the noise period (1) is short. Therefore, an output signal at the output terminal C takes a previous state of H level. Thereafter, the noise N is delayed by the delay circuit DL2 and reaches point B. The transistor Tr23 is off at this time so that the noise will not appear at the output terminal C.

Figure 17:
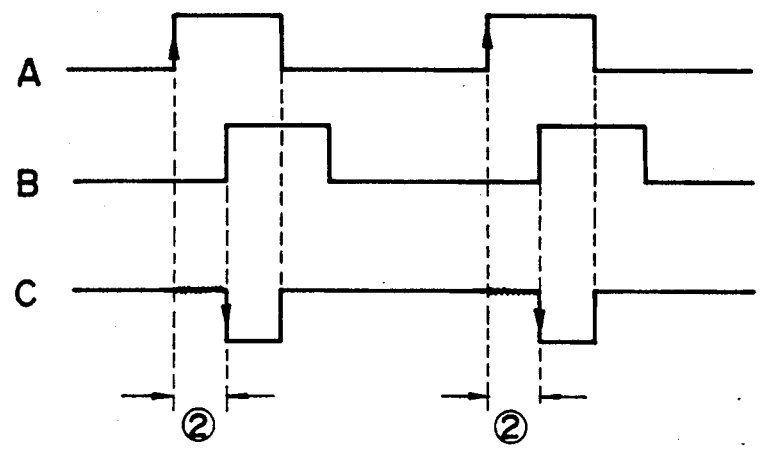
Figure 18:
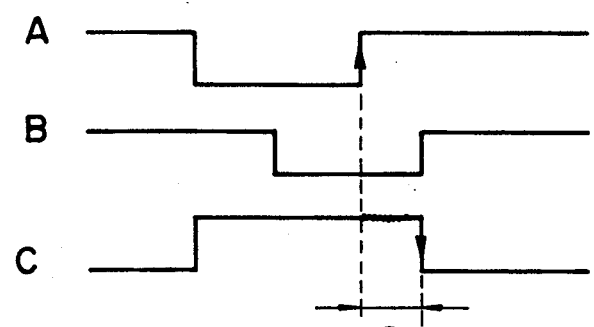

FIGS. 17 and 18 illustrate a trailing edge delay operation. Although the high impedance state is retained at the output terminal C during the periods (2) and (3) respectively shown in FIGS. 17 and 18, there is no problem during these periods (2) and (3) because of the same reason described with the period (1).

Figure 19:
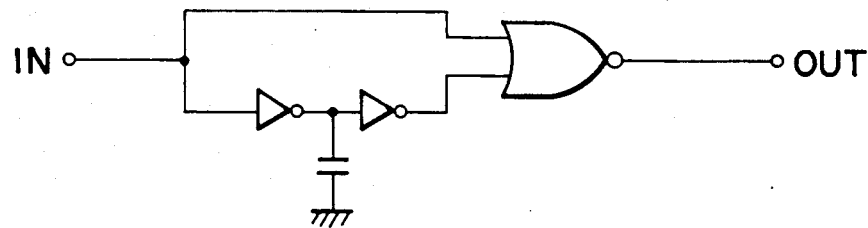
FIG. 19 is a basic circuit diagram of another noise eliminator/trailing edge delay circuit.
Figure 20:
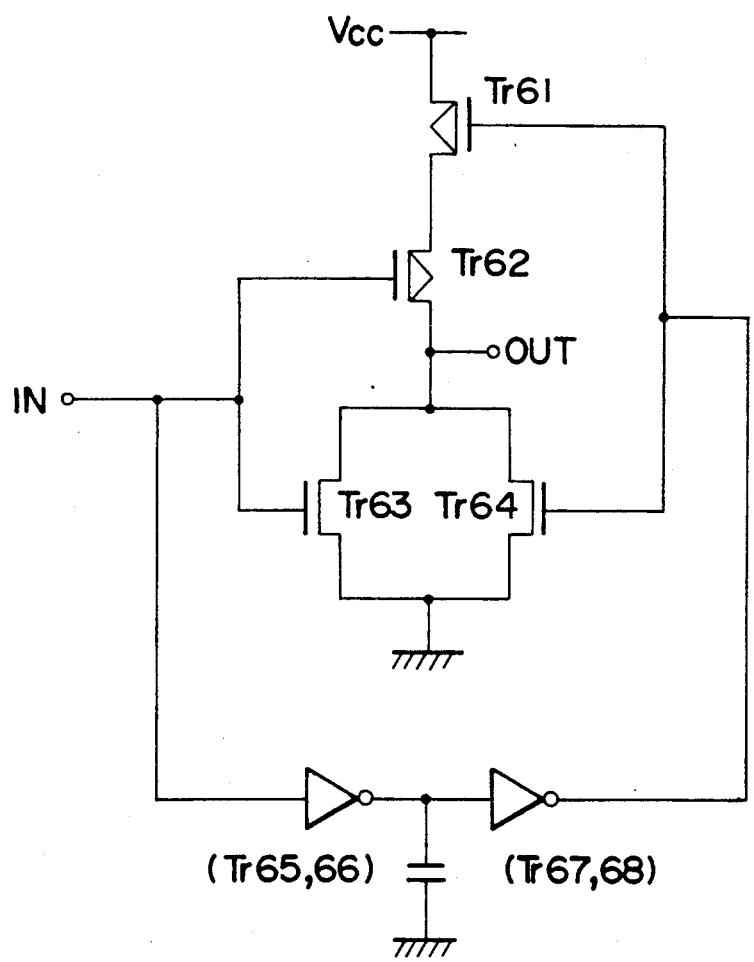
FIG. 20 is a circuit diagram showing an example of a conventional circuit similar to the circuit shown in FIG. 19.
Figure 21:
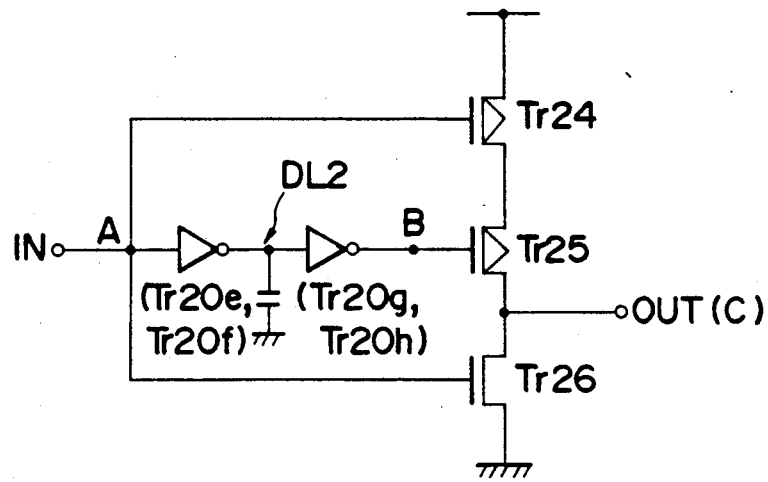
FIG. 21 is a circuit diagram showing an embodiment of the circuit shown in FIG. 19.

The second circuit is shown in FIG. 21, and its equivalent circuit is shown in FIG. 19. The operation of this circuit is illustrated in FIGS. 22 to 24.

Figure 22:
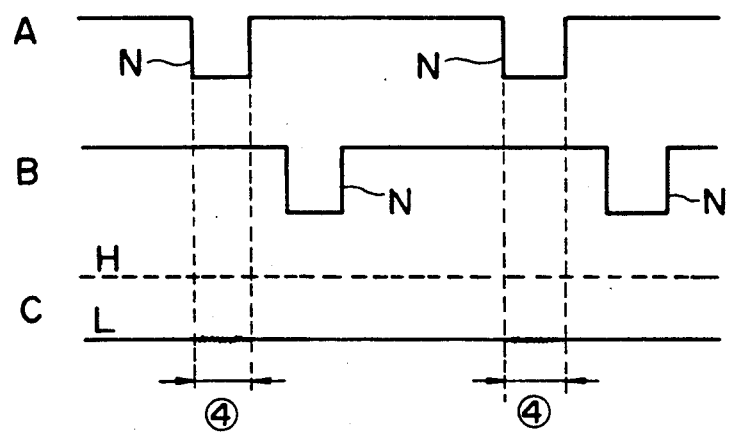
FIGS. 22 to 24 are timing charts illustrating examples of the operation of the circuit shown in FIG. 19.

FIG. 22 illustrates a noise eliminating operation. Referring to FIG. 22, it is assumed that a noise N is superposed on a signal at the input terminal IN. This noise N is transmitted to the transistor Tr26 so that its output becomes a high impedance state (tri-state). This second circuit processes an internal signal so that its load is negligibly small, and the noise period (4) is short. Therefore, an output signal at the output terminal C takes a previous state of L level. Thereafter, the noise N is delayed by the delay circuit DL2 and reaches point B. The transistor Tr24 is off at this time so that the noise will not appear at the output terminal C.

Figure 23:
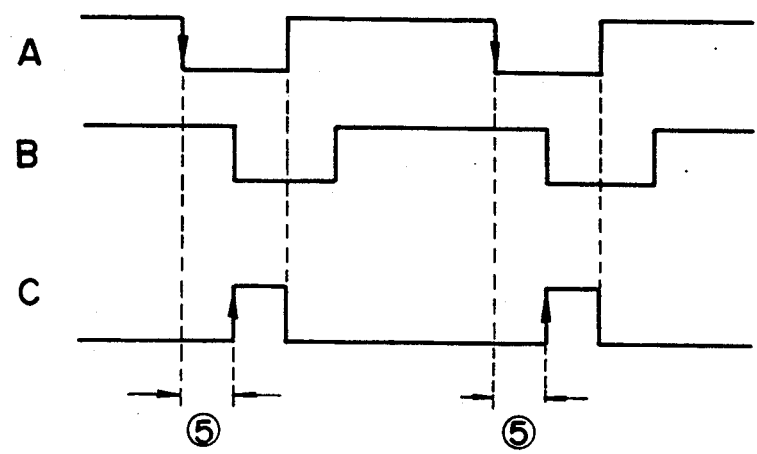
Figure 24:
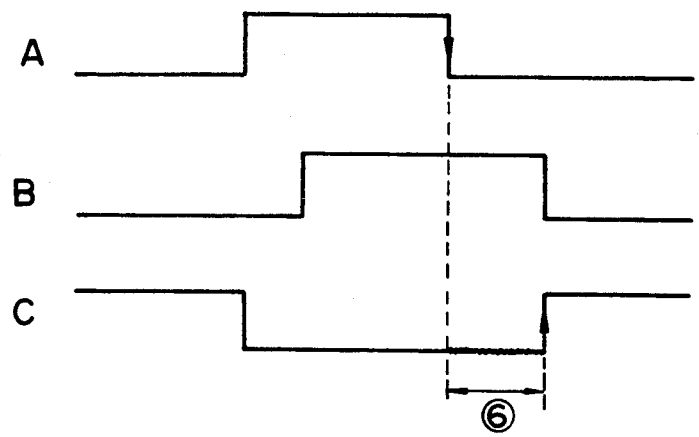
Figure 25:
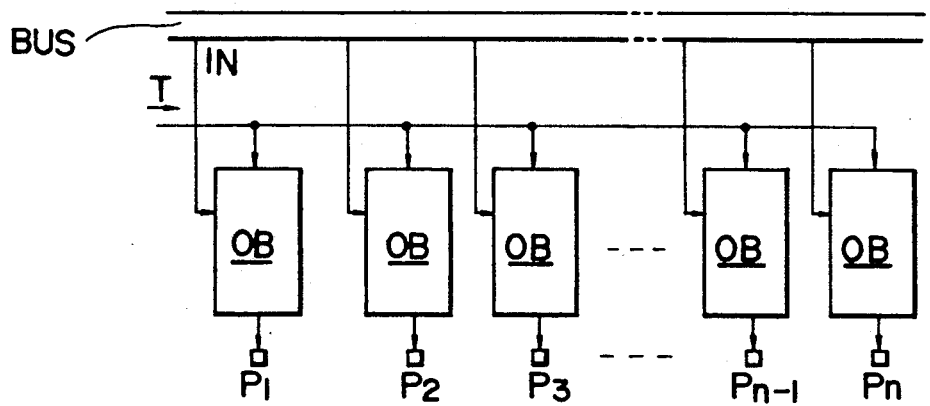
FIG. 25 is a block diagram of a conventional output buffer.
Figure 26:
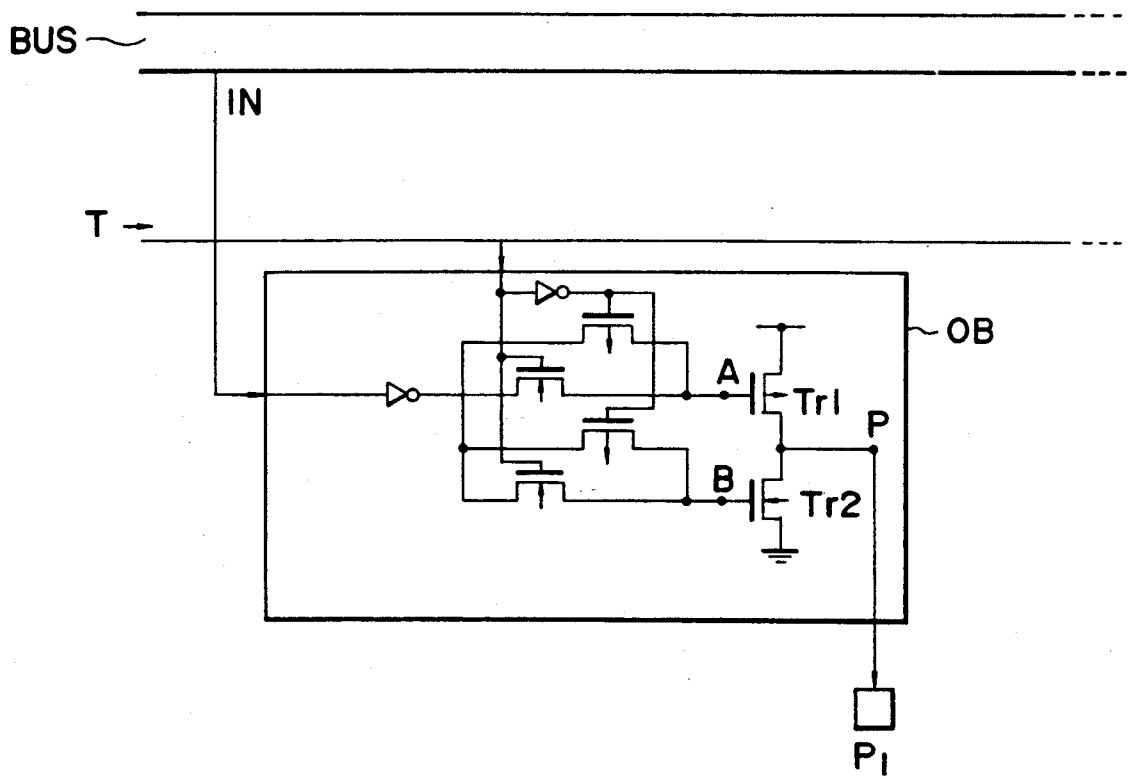
FIGS. 26 and 27 show different examples of an output buffer.
Figure 27:
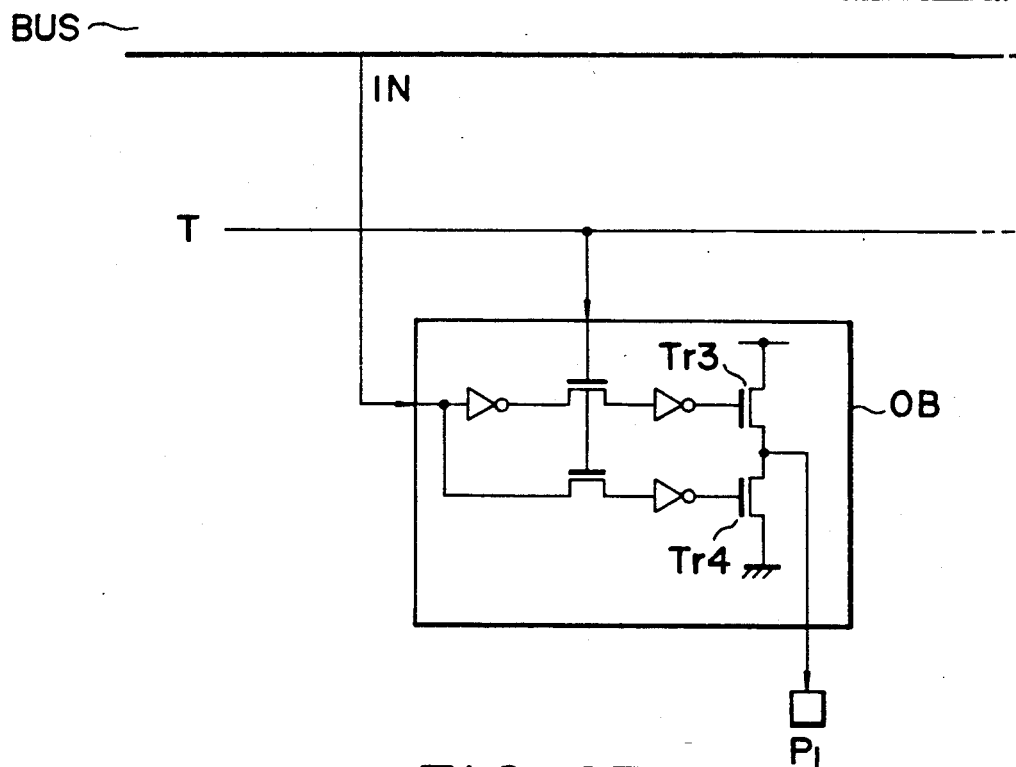
Figure 28:
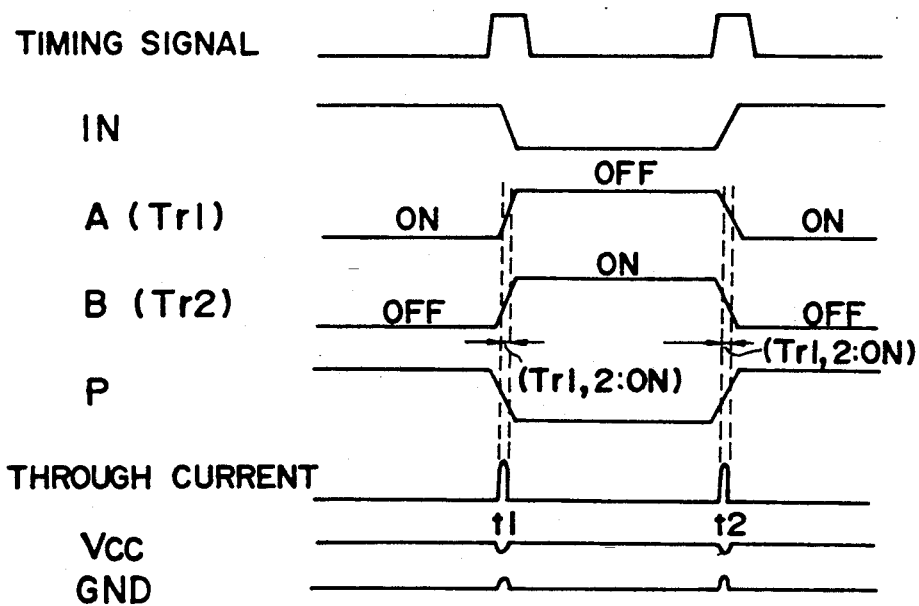
FIGS. 28 and 29 are timing charts illustrating examples of the operation by the output buffer shown in FIG. 26.
Figure 29:
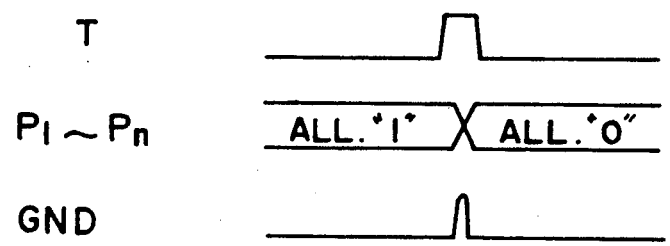
Figure 30:
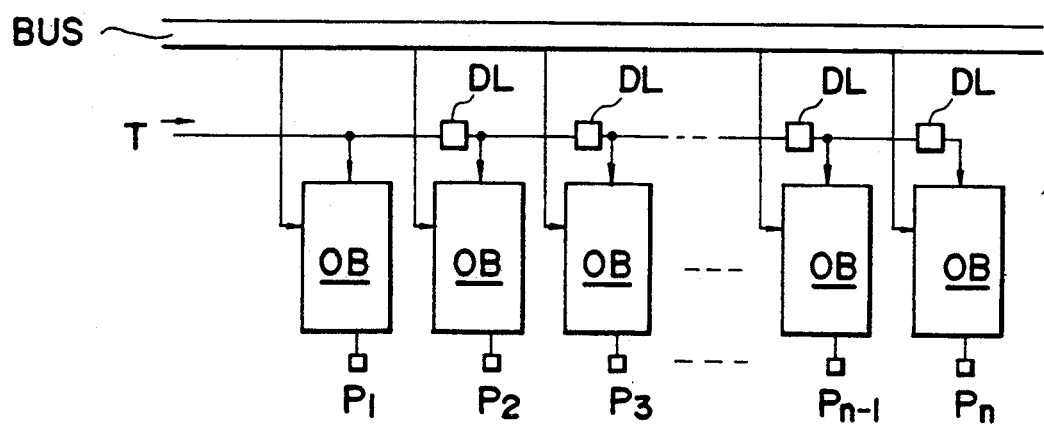
FIG. 30 is a block diagram showing output buffers whose operation timings are shifted.
Figure 31:
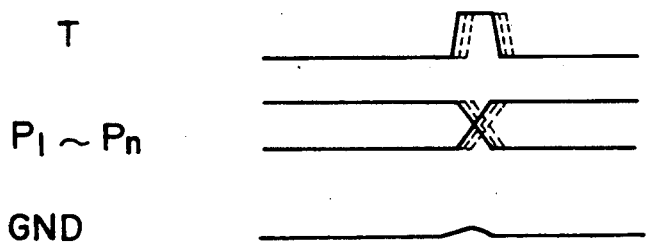
FIGS. 31 to 34 are timing charts and circuit diagrams used for explaining the operation of the circuit shown in FIG. 30.
Figure 32:
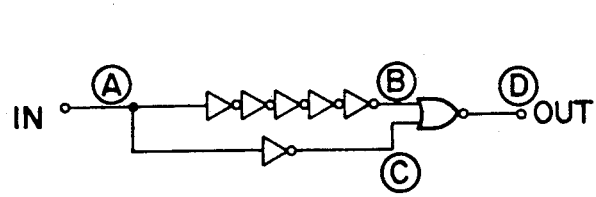
Figure 33:
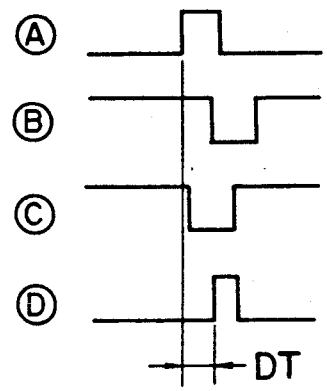
Figure 34:
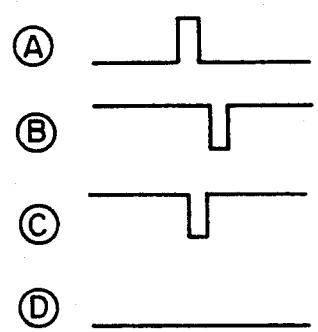

FIGS. 23 and 24 illustrate a trailing edge delay operation. Although the high impedance state is retained at the output terminal C during the periods (5) and (6) respectively shown in FIGS. 23 and 24, there is no problem during these periods (5) and (6) because of the same reason described with the period (4).

Figure 14:
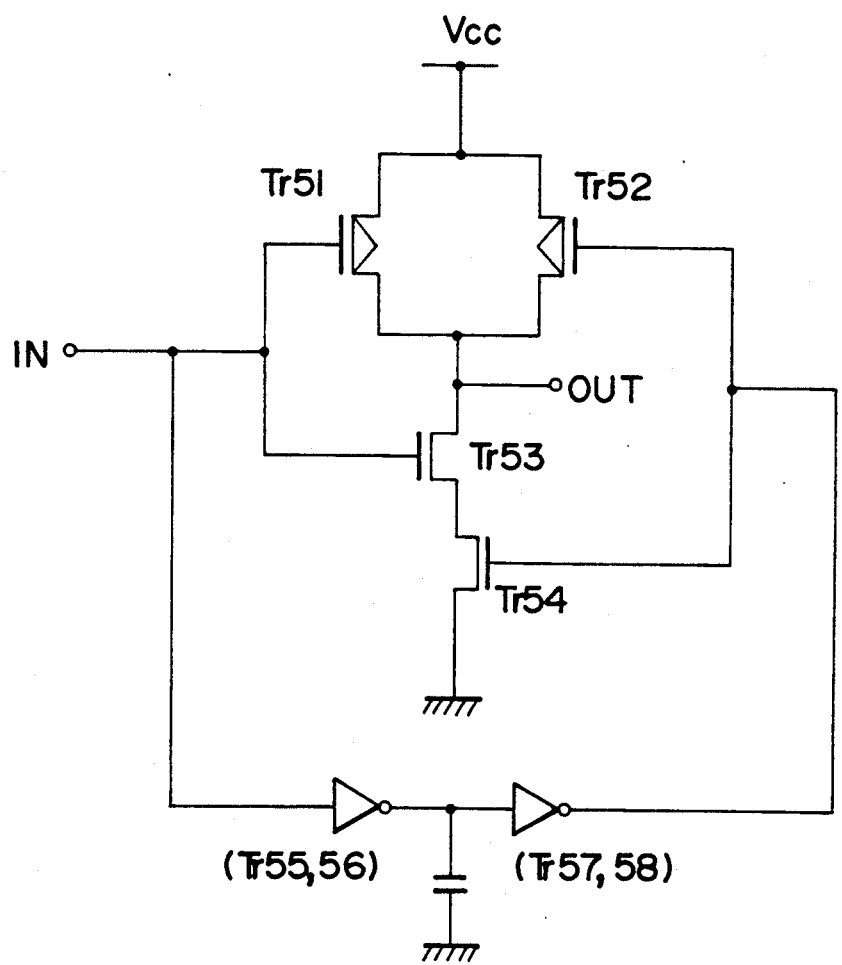
FIG. 14 is a circuit diagram showing an example of a conventional circuit similar to the circuit shown in FIG. 13.

As seen from the embodiment circuits shown in FIGS. 15 to 21, the number of transistors is reduced by one as compared with conventional circuits. Specifically, the equivalent circuit shown in FIG. 13 of the circuit of FIG. 15 has been realized heretofore generally by the circuit shown in FIG. 14 which requires eight transistors Tr51 to Tr58. In contrast, the embodiment circuit shown in FIG. 15 requires seven transistors Tr21 to Tr23, and Tr20a to Tr20d. This is also true for the circuits shown in FIGS. 20 and 21. Namely, the conventional circuit shown in FIG. 20 requires eight transistors Tr61 to Tr68, whereas the embodiment circuit shown in FIG. 21 requires seven transistors Tr24 to Tr26, and Tr20e to Tr20h.

What is claimed is:

1. A data output buffer circuit for a semiconductor integrated circuit having a plurality of output buffer circuits, each output buffer circuit comprising:
   input means including an input terminal for receiving input data, and an input buffer stage coupled to said input terminal;
   an output buffer having first and second switching means serially connected between two high and low power source terminals, each of said first and second switching means having a control terminal for turning on and off each of said first and second switching means upon reception of a control signal to said control terminal;
   timing switch means connected between said input terminal and said output buffer and having a timing signal input terminal for receiving a timing signal for turning on said timing switch means;
   a delay circuit connected between said timing switch means and said control terminals of said first and second switching means, for delaying said input data to said input terminal and transmitting said delayed input data to said control terminals of said first and second switching means, the delay time of said delay circuit of one of said output buffer circuits being different from the delay time of another of said output buffer circuits; and
   an output terminal connected to an interconnection between said first and second switching means.

2. A data output buffer circuit according to claim 1, wherein the delay time of said delay circuit is different for all of said output buffer circuits.

3. A data output buffer circuit according to claim 1, wherein said delay circuits are divided into a plurality of groups, a plurality of said delay circuits within each group have the same delay time, and the delay time is different between different groups.

4. A data output buffer circuit according to claim 2, wherein said delay circuits are arranged in such an order that the delay time of one delay circuit is larger than that of another delay circuit located next to said one delay circuit in one direction.

5. A data output buffer circuit according to claim 1, wherein each of said delay circuits comprises at least one of serially connected invertors, a resistor and a capacitor, the delay time of said delay circuit depending on at least one of the number of said invertors, the resistance value of said resistor and the capacitance of said capacitor.

6. A data output buffer circuit according to claim 2, wherein each of said delay circuits comprises at least one of serially connected invertors, a resistor and a capacitor, the delay time of said delay circuit depending on at least one of the number of said invertors, the resistance value of said resistor and the capacitance of said capacitor.

7. A data output buffer circuit according to claim 3, wherein each of said delay circuits comprises at least one of serially connected invertors, a resistor and a capacitor, the delay time of said delay circuit depending on at least one of the number of said invertors, the resistance value of said resistor and the capacitance of said capacitor.

8. A data output buffer circuit according to claim 4, wherein each of said delay circuits comprises at least one of serially connected invertors, a resistor and a capacitor, the delay time of said delay circuit depending on at least one of the number of said invertors, the resistance value of said resistor and the capacitance of said capacitor.

* * * * *